United States Patent [19]

Lo et al.

[11] Patent Number: 5,656,216
[45] Date of Patent: Aug. 12, 1997

[54] METHOD FOR MAKING METAL OXIDE SPUTTERING TARGETS (BARRIER POWDER ENVELOPE)

[75] Inventors: Chi-Fung Lo, Fort Lee, N.J.; John Turn, Chestnut Ridge, N.Y.; David P. Strauss, Glen Rock, N.J.

[73] Assignees: Sony Corporation, Tokyo, Japan; Materials Research Corporation, Gilbert, Ariz.

[21] Appl. No.: 295,594

[22] Filed: Aug. 25, 1994

[51] Int. Cl.$^6$ .............................. B22F 3/15; C04B 35/453
[52] U.S. Cl. .......................... 264/113; 264/109; 264/332; 264/338; 264/DIG. 36
[58] Field of Search .................. 264/120, 332, 264/DIG. 36, 109, 56, 57, 58, 60, 338, 122; 425/420, 812; 501/126, 134

[56] References Cited

U.S. PATENT DOCUMENTS

| | | | |
|---|---|---|---|
| 716,343 | 12/1902 | Locke | 425/420 |
| 2,886,849 | 5/1959 | Brierley | 425/420 |
| 3,892,835 | 7/1975 | Holdsworth | 264/332 |
| 4,049,523 | 9/1977 | Boehnke et al. | |
| 4,094,672 | 6/1978 | Fleck et al. | |
| 4,382,053 | 5/1983 | Rigby | 264/120 |
| 4,647,548 | 3/1987 | Klein | 501/134 |
| 5,094,787 | 3/1992 | Nakajima et al. | 264/65 |
| 5,145,811 | 9/1992 | Lintz et al. | 501/95 |
| 5,160,675 | 11/1992 | Iwamoto et al. | 264/56 |
| 5,382,405 | 1/1995 | Lowrance, II et al. | 505/125 |

FOREIGN PATENT DOCUMENTS

| | | |
|---|---|---|
| 0115629 | 8/1984 | European Pat. Off. . |
| 0342537 | 11/1989 | European Pat. Off. . |
| 2316348 | 4/1972 | Germany . |
| 2651311 | 5/1977 | Germany . |
| 3912711 | 12/1989 | Germany . |
| 4124471 | 6/1992 | Germany . |
| 5642612 | of 1979 | Japan . |
| 5879872 | of 1981 | Japan . |
| 57-029407 | 2/1982 | Japan . |
| 58-079872 | 5/1983 | Japan . |
| 243356 | 2/1990 | Japan . |
| 3199373 | 8/1991 | Japan . |
| 4074860 | 3/1992 | Japan . |
| 4154654 | 5/1992 | Japan . |
| 4293769 | 10/1992 | Japan . |
| 4341504 | 11/1992 | Japan . |
| 857075 | 8/1981 | U.S.S.R. . |
| 1220592 | 1/1971 | United Kingdom . |
| 1415482 | 11/1975 | United Kingdom . |
| 2147011 | 5/1985 | United Kingdom . |
| 8401369 | 4/1984 | WIPO . |
| 9418138 | 8/1994 | WIPO . |

OTHER PUBLICATIONS

B. L. Gehman et al., "Influence of manufacturing process of indium tin oxide sputtering targets on sputtering behavior", Thin Solid Films, 220 (1992), 333–336.

"Electroceramics Materials • properties • applications", A.J. Moulson et al., pp. 353–355, 1990.

"Vapor–phase processing converts refractory metals into ceramics", G.W. Billings, Tech Spotlight, pp. 45 & 46, Advanced Materials & Processes, Apr. 1993.

"Kinetics Studies on the Oxidation of Carbon Monoxide over Pure, Reduced, and Doped Indium Sesquioxides", Sung Han Lee et al. Int'l. J. of Chem. Kinetics, vol. 19, 1–2 (1987).

Brochure: "NX–100™ Series of Titanium Carbide Coated Graphite", Lanxide Corp. (undated).

*Primary Examiner*—David A. Simmons
*Assistant Examiner*—Kenneth M. Jones
*Attorney, Agent, or Firm*—Wood, Herron & Evans, L.L.P.

[57] ABSTRACT

An apparatus and process for making metal oxide sputtering targets from volatile and thermally unstable metal oxide powder by enveloping the metal oxide powder in at least one layer of a barrier material while the powder is hot-pressed using a graphite die assembly.

25 Claims, 4 Drawing Sheets

METHOD FOR MAKING METAL OXIDE SPUTTERING TARGETS (BARRIER POWDER ENVELOPE)

FIELD OF THE INVENTION

The present invention relates to the manufacture of sputtering targets, more particularly to the manufacture of sputtering targets from volatile and thermally unstable metal oxides, and even more particularly to the manufacture of indium oxide and tin oxide sputtering targets.

BACKGROUND OF THE INVENTION

Thin films are often produced using plasma sputtering techniques. Targets are used during the sputtering process as the source of material for the film being deposited onto a substrate. Targets made from volatile and thermally unstable metal oxides have been used to sputter thin films which exhibit properties useful in a variety of applications. For example, thin films of electro-optic materials, such as indium oxide and tin oxide, are known to exhibit high transmittance and low resistivity. These materials are commonly used as electro-conductive films in electroluminescence (EL) displays, liquid crystal displays, solar cells, defrost/defog heaters for airplanes and the like.

Previous methods used to make sputtering targets from such volatile and thermally unstable metal oxides have included consolidating, such as by hot-pressing, powders of the metal oxide target starting material, like $In_2O_3$ and $SnO_2$, into a target blank in an inert gas environment. Graphite or ceramic die assemblies with a die cavity have typically been used to press the powdered material. With a number of these prior processes, in particular prior processes for making indium oxide and tin oxide (ITO) targets, the metal oxide powder was loaded into the die cavity such that the powder was in direct contact with the walls of the die cavity. After consolidation, the resulting target blank was typically formed, such as by machining, grinding, polishing, etc., into a finished target. Detailed descriptions of a number of prior processes for making ITO sputtering targets may be found in U.S. Pat. Nos. 5,160,675 and 5,094,787 and in Japanese Patent Nos. 04341504, 04293769, 04154654, 04074860, 03199373 and 02043356.

The production of metal oxide targets, notably ITO targets, using graphite die assemblies have been known to exhibit a number of chronic problems associated with interaction between the powdered target starting material and the graphite material of the die assembly. The problems have included the full reduction of the metal oxide to metal, at least in the form of a layer on the outer surface outside of the resulting target blank. Removal of this metal layer is generally necessary before the target is suitable for use. However, removal of the reduced metal, for example, a layer of indium or indium-tin alloy on an ITO target, often results in cracks initiating in the target or the target actually fracturing and having to be scrapped. The formation of cracks in the target reduces its resistance to fracturing during use. Lower pressing temperatures and/or shorter times at temperature have been used in order to avoid the formation of a reduced metal layer while still using a graphite die assembly to press the powder. Pressing at lower temperatures and/or shorter times typically results in poor consolidation of the powdered target starting material. Such poor consolidation typically results in targets with low densities, low strength and/or a low resistance to fracturing (i.e., low toughness).

The density, strength and toughness of a target is often very important to the target's performance. Reportedly, high density ITO targets are required in order to sputter high quality ITO thin films, in particular, thin films free from particles. In addition, good strength and toughness are typically necessary to successfully form the ITO target blank into the desired target shape. ITO targets with good toughness are also less likely to fracture during the sputtering process. Such fracturing can result in relatively large particles being deposited onto the substrate, often generating defects in the ITO film. Such defects in the ITO film can adversely affect the electro-optic properties of the film.

ITO and other such metal oxide sputtering targets produced with die assemblies made of a ceramic, such as $Al_2O_3$ or $ZrO_2$, are less likely to exhibit the problems noted above when graphite die assemblies are used. However, such ceramic die assemblies are generally more expensive to manufacture, less resistant to thermal shock and not as thermally conductive as comparable graphite die assemblies. Ceramic dies are thus more likely to crack during use, require longer heating and soaking times during the hot-pressing operation, and generally increase the costs of the target manufacturing process.

Therefore, there is a need for a more cost effective method of manufacturing denser, stronger and tougher sputtering targets made from volatile and thermally unstable metal oxides.

SUMMARY OF THE INVENTION

The present invention is directed to a less expensive apparatus and process for consistently making acceptable sputtering targets by hot-pressing metal oxides that are volatile and thermally unstable at the hot-pressing temperature.

A general aspect of the present invention is directed to such an apparatus and process using a graphite die assembly.

A particular aspect of the present invention is directed to such an apparatus and process for consistently making relatively higher density, higher strength and tougher indium oxide and tin oxide (ITO) sputtering targets using a graphite die assembly.

According to the general principles of the present invention, a powder of a first material, also termed a target starting material, which includes metal oxide particles is encased or surrounded by at least one layer of a second material, also termed a barrier material, as the first material is hot-pressed at an elevated temperature into a target blank in an oxygen-free, preferably an inert gas, environment. The metal oxide particles in the powdered target starting material are volatile and thermally unstable at the elevated hot-pressing temperature. In the present invention, the target starting material and the barrier material are disposed in the die cavity of a graphite die assembly. While in the graphite die cavity, these materials are bonded together by applying a sufficiently high temperature and pressure, and for a long enough period of time to produce a metal oxide sputtering target having a density, strength and toughness suitable for sputtering films of desirable quality. The at least one layer of the barrier material is sufficient to substantially prevent a reducing gas from penetrating through to the unstable target starting material during the hot-pressing operation, thereby preventing any significant degree of full reduction of the metal oxide target material to metal. Preferably, the barrier material is also sufficient to substantially protect the graphite die assembly from being attacked and degraded by any dissociated components of the metal oxides during hot-pressing.

At elevated hot-pressing temperatures, these volatile and thermally unstable metal oxides break down or dissociate into oxygen gas and reduced oxides which may or may not be volatile, depending upon the temperature attained. For example, when the ITO material is subjected to hot-pressing temperatures of greater than or equal to about 850° C., the indium oxide, such as $In_2O_3$, may begin to dissociate into free and reactive oxygen gas and lower order indium oxides. Depending upon the hot-pressing temperature, some of these lower order indium oxides, like $In_2O$, may vaporize while the balance of the indium oxide remains stable (i.e., in solid form). The dissociation of $In_2O_3$ is evidenced by color changes in the ITO material. $In_2O_3$ is yellow, while $In_2O$ is black. Typically, it is desirable for the target to have a uniform color which is indicative of a uniform composition. For at least some ITO targets, a uniform dark blue color is preferred. The present invention enables targets with such a uniform color to be consistently produced in a cost effective manner.

In the absence of the protection afforded by the barrier material, hot-pressing at such elevated temperatures will likely result in the oxygen (O) gas reacting with carbon (C) from the graphite die assembly generating carbon monoxide (CO) gas. The CO gas will in turn react with $In_2O_3$ and other indium oxides, thereby forming metallic indium (In) and carbon dioxide ($CO_2$). The resulting indium metal melts and tends to diffuse into the remaining oxide material such that the target blank has an outer coating of this reduced metal with an inner core of any remaining metal oxide. Because indium metal is difficult to remove without cracking or fracturing the target blank, such target blanks are typically unsuitable for further processing into finished targets and are scrapped. In addition, reduction of the ITO material has been found to shorten the life of the graphite die due to oxidation of the graphite by the liberated oxygen gas. Oxidation of the graphite may cause the die to crack during hot-pressing. Thus, it has been found that by isolating the powdered ITO target starting material with an appropriate barrier material, reduction of the indium oxide to indium metal during hot-pressing and the problems associated therewith may be eliminated or at least significantly reduced.

In one embodiment of the ITO target manufacturing apparatus and process of the present invention, two layers of barrier material surround the powdered ITO target starting material in order to better ensure that an adequate barrier is provided. One of these layers includes a metal oxide that is more stable than the ITO material, such as $Al_2O_3$, MgO, $TiO_2$, $ZrO_2$, and combinations thereof. The other layer includes a non-oxide ceramic, such as a metal carbide, examples of which are $Cr_7C_3$, SiC, TaC, TiC, ZrC, and combinations thereof. Satisfactory results have been obtained by using a layer of the more stable ceramic metal oxide as an inner layer and a layer of the metal carbide as an outer layer, both surrounding the powdered ITO target starting material. As a specific example, the walls of the die cavity may be coated with a layer of metal carbide, and the ITO powder may be encased by a powder layer of the more stable ceramic metal oxide.

Attempts at avoiding significant reduction of the powdered ITO target starting material in order to continue using graphite die assemblies have included lowering the temperature and/or shortening the time at temperature during hot-pressing. However, such process changes typically resulted in target blanks having undesirable mechanical properties (i.e., low density, strength and toughness). Implementation of the layer or layers of barrier material according to the present invention has enabled much higher pressing temperatures and longer pressing times to be used with graphite dies while significantly decreasing the amount of ITO material reduced to metal, as well as decreasing oxidation of the graphite dies. In this way, relatively low cost targets having improved properties may be manufactured.

Even when ITO and other metal oxide target starting materials are protected from reducing gases, the starting material may still be partially reduced, thereby dissociating vaporous and gaseous components. The extent of such dissociation typically depends on the pressing temperature and the time at temperature. It has been determined that when these vapors and gases are trapped inside the powdered target material and not allowed to escape, lower quality targets may be produced. Trapped vapor or gas tends to cause inconsistent consolidation of the powdered target material (i.e., bonding between powder particles), thereby lowering the density, strength and toughness of the final target. Such retained vapor or gas also tends to cause poor color uniformity in the resulting target. It is believed that such discoloration may be due, at least in part, to the trapped vapors and gases recombining into higher order oxides of different color when the target blank cools.

It has been found that smaller targets do not exhibit the above-noted problems associated with such retained gases to the same extent as larger targets. It is believed that this difference is due, at least in part, to two causes. For larger targets, more powdered target starting material is used which causes a proportional increase in the production of dissociated vaporous and gaseous components. In addition, because of the target's larger size, the vapors and gases produced near the center of the powdered target material have further to travel to exit from the die cavity. Graphite die assemblies typically include a cylindrical die tube or ring and two opposing cylindrical die punches which slide longitudinally within the inside diameter of the die ring compressing the powder therebetween. The walls of the die cavity are formed by the leading surfaces of the two die punches and the inside surface of the die ring. The only escape for vapor or gas generated during the hot-pressing operation is between the die punches and the die ring.

To avoid the drawbacks of retaining such vapors and gases in the powdered target material during hot-pressing, an optional feature of the present apparatus and method was developed to minimize the amount of vapor and gas trapped during hot-pressing. This feature includes a gas release device which facilitates the venting of such vapor and gas from the die cavity. In general, the gas release device has two surfaces connected by a plurality of pathways. The gas release device is disposed within the die cavity such that one surface faces the powdered target material and the other surface faces at least one wall of the die cavity. The pathways are constructed so that vapor and gas generated during hot-pressing can flow from the powdered target material, through the pathways and out of the die cavity between the die punches and the die ring.

In one embodiment, the gas release device is a perforated disk, each disk having two flat surfaces. Two such disks are positioned in the die cavity, each with one surface facing a respective die punch and the other surface facing the powdered target material. Each disk has a plurality of channels or grooves formed in the surface facing the die punch. Each groove leads to the outer edge or periphery of the disk. A plurality of through holes connect these grooves to the surface of the disk facing the target material. In this way, vapor and gas escaping from the powdered target material can flow through the holes and along the grooves to the outer periphery of the disk and out of the die assembly between the die punches and the die ring. By, venting more of the dissociated vapors and gases, targets may be produced which exhibit higher densities, greater strength, and better toughness, while maintaining more uniform color.

Another feature of the present invention further reduces the amount of vapor and gas retained in the powdered target material during hot-pressing. This is accomplished by subjecting the powdered target starting material to a heat treatment before the hot-pressing operation. This heat treatment involves heating the starting powder to a temperature which causes partial reduction of the metal oxide without bonding the powder particles bonding together (i.e., sintering) to any significant degree. In this way, at least some of the dissociated vaporous and gaseous components of the target starting material are driven off before the hot-pressing operation. Thus, smaller amounts of vapor and gas are produced during hot-pressing and captured within the powdered target starting material. The heat treatment should be performed in an oxygen-free environment, such as an inert gas atmosphere. Preferably, a mild reducing environment is used to accelerate this partial reduction while avoiding any significant grain growth (i.e., sintering) or formation of reduced metal. For example, a sheet of graphite foil may be introduced into the environment to cause this acceleration. Thus, by partially reducing the powdered target material before hot-pressing, targets having even higher densities, greater strength, better toughness and more uniform color may be obtained.

In the present target manufacturing apparatus and process, the second (barrier) material is intended to provide a barrier between the powdered metal oxide target material and any reducing gas coming from the graphite die material. This barrier eliminates or at least significantly avoids full reduction of the ceramic metal oxide into metal, as well as oxidation of the graphite die material. Thus, the present invention makes it possible to use graphite die assemblies to hot-press powders of ITO materials, and similar volatile and thermally unstable metal oxides, into denser, stronger and tougher sputtering targets than heretofore thought possible. In addition, the gas release feature of the present invention significantly reduces the amount of vapor or gas trapped in the powdered target starting material during hot-pressing, thus enabling such targets to be made with even better properties including more uniform color. To further reduce the amount of these vapors and gases trapped in the powdered target starting material, and thereby further improve the target properties, the powdered target starting material may be subjected to a heat treatment to drive off a portion of such volatiles before hot-pressing. Utilizing the principles of the present invention, ITO sputtering targets have been produced which exhibit a minimum density of about 95% (6.81 g/cc) of theoretical density and a minimum flexure strength of about 90 MPa, with high crack resistance (i.e., toughness) and color uniformity.

The principles of the present invention, its objectives and advantages will be further understood with reference to the drawings and the following detailed description.

DETAILED DESCRIPTION OF THE INVENTION

While the method and apparatus of the present invention are described with specific reference to a particular target starting material, the present invention is not to be so limited but is applicable to other such volatile and thermally unstable metal oxide target starting materials.

Figure 1:
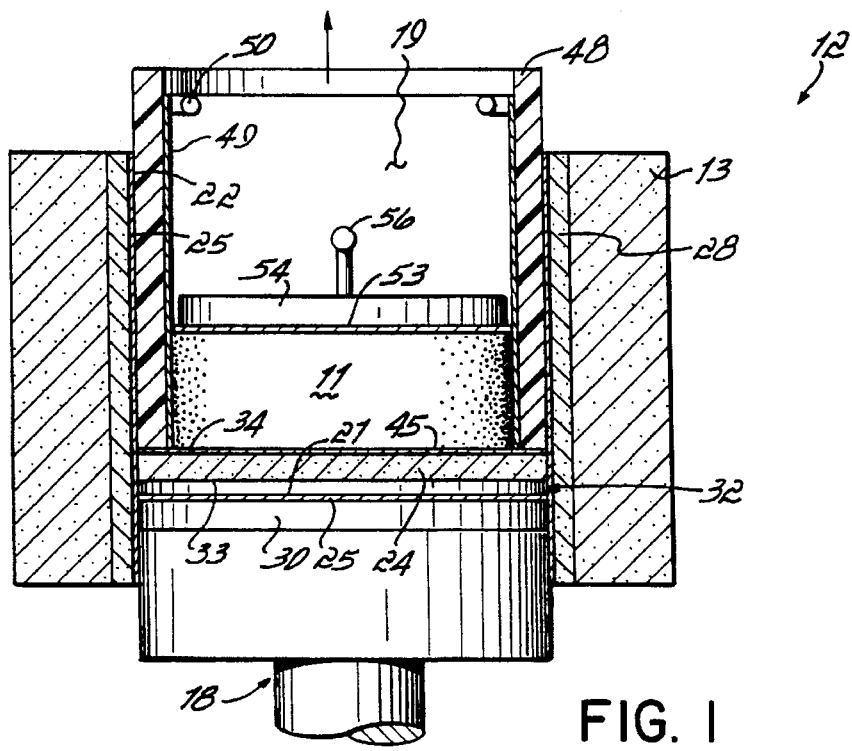
FIG. 1 is a schematic, sectional side view of a graphite die assembly at an initial stage of being loaded with a powdered target starting material in accordance with the present invention.
Figure 2:
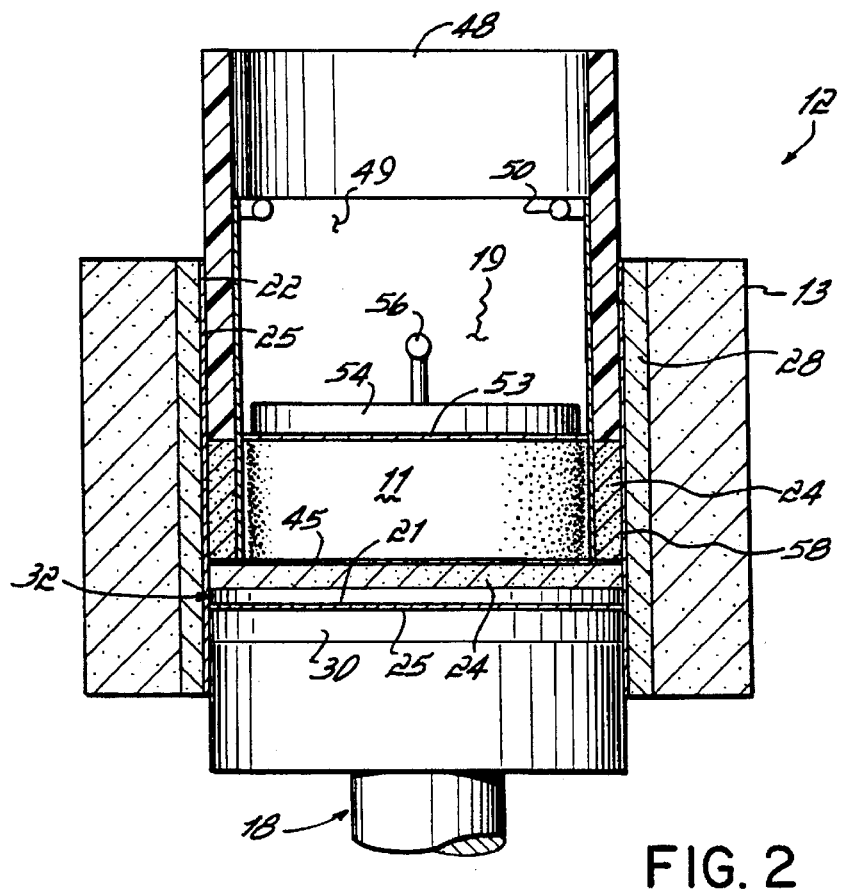
FIG. 2 is a schematic, sectional side view of the graphite die assembly of FIG. 1 at a subsequent stage in the loading process.
Figure 3:
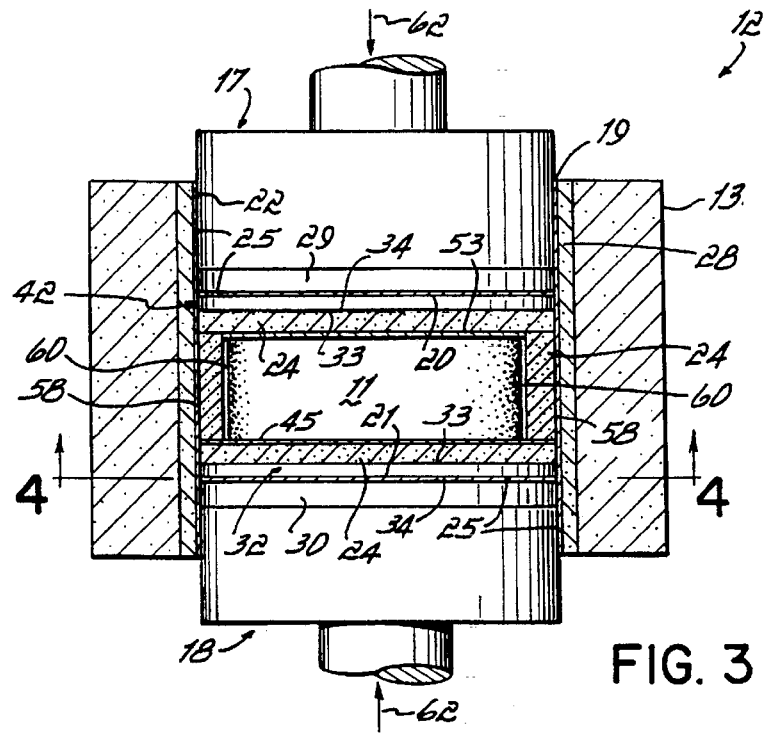
FIG. 3 is a schematic, sectional side view of the graphite die assembly of FIG. 1 in a fully loaded condition.

Referring to FIGS. 1-3, the materials and equipment utilized in one target manufacturing process according to the present invention include a first or target starting material 11 in powder form which is hot-pressed at an elevated temperature into a target blank (not shown) using a graphite die assembly 12. The powdered target material 11 includes particles of mixed metal oxide which are volatile and thermally unstable at the elevated temperatures reached during the hot-pressing operation. For exemplary purposes only, the powdered target material 11 described herein in detail is an indium oxide and tin oxide (ITO) powder blend comprising two powdered constituents, $In_2O_3$ and $SnO_2$. Satisfactory results have been obtained using a powder blend of about 5% to about 15% by weight $SnO_2$ and the balance being substantially $In_2O_3$, with powder sizes (i.e., the size of aggregate particles) being less than about 325 mesh (44 microns) and individual particles being less than about 1 micron in size. The grain sizes of exemplary targets produced from such target starting powders 11 have been found to be in the range of about 1 micron to 15 microns. It is believed that the principles of the present invention are equally applicable to other ITO materials such as $In_2SnO_5$, as well as other volatile and thermally unstable metal oxide target materials.

The graphite die assembly 12 includes a cylindrical graphite tube or ring 13 and a pair of opposing graphite punches 17 and 18 which are dimensioned to snugly slide relative to one another within the graphite ring 13 in accordance with well known graphite die assembly construction. Except for those elements, features and modifications described in detail herein, the graphite die assembly 12 used in the present invention is constructed and operated in accordance with well established manufacturing and operating techniques. Related equipment which does not constitute a part of the present invention is readily known and understood by persons skilled in the art and is therefore not described in detail herein.

The graphite die assembly 12 forms a die cavity 19 in which the ITO powder 11 is pressed. The die cavity 19 includes a top wall 20 formed by the leading surface of the upper punch 17, a bottom wall 21 formed by the leading surface of the lower punch 18, and a side wall 22 formed by the inside surface of the die ring 13. Without some way of isolating the ITO powder 11 and the graphite walls 20, 21 and 22 from each other, at the elevated temperatures reached during the present hot-pressing operation, the ITO powder 11 and carbon from the graphite walls 20, 21 and 22 would react and form fully reduced metal and cause degradation of the graphite material. Typically, such reduced metal forms a layer surrounding any remaining ITO powder 11, and such degradation results in cracking of the die assembly 12. One or more layers of a second or barrier material may be used to eliminate or at least substantially prevent such full reduction of the powdered ITO target material 11 to metal and the graphite die material from being significantly attacked during the hot-pressing operation.

In an ITO target manufacturing process according to the present invention, the barrier material includes a first or inner layer 24 of a ceramic metal oxide powder and a second or outer layer 25 of a non-oxide ceramic coating, with each being more stable at the hot-pressing temperatures reached than the powdered target material 11. The walls 20, 21 and 22 of the die cavity 19 are coated with the non-oxide ceramic 25 and the metal oxide powder 24 is deposited into the cavity 19 in the form of an envelope, completely surrounding the ITO powder 11. Satisfactory results have been obtained in hot-pressing the exemplary ITO powder using an envelope of $Al_2O_3$ powder as the inner barrier layer 24 and a coating of TiC as the outer barrier layer 25. The $Al_2O_3$ powder layer 24 preferably has a thickness of about 0.25 inches, with powder sizes being less than about 325 mesh (44 microns) and individual particles being less than about 1 micron in size. $Al_2O_3$ powder layers 24 having a thickness in the range of about 0.2 to about 0.5 inches should produce acceptable results. Using a TiC coating 25 having a thickness ranging from about 30 microns to about 100 microns has produced acceptable results. The TiC coating 25 should have a density of at least about 90% but preferably as close to 100% of theoretical density as possible. TiC coatings of less than about 90% of theoretical density have been found to be inadequate in protecting the underlying graphite.

It is believed that ceramic oxides other than $Al_2O_3$ may be used for the inner powder layer 24, including MgO, $TiO_2$, $ZrO_2$, and various combinations thereof. It is also believed that non-oxide ceramics other than TiC may be used for the outer layer 25, including the carbides $Cr_7C_3$, SiC, TaC, ZrC, and combinations thereof. The thicknesses of the barrier layers 24 and 25 are preferably kept as thin as possible in order to limit any resulting increase in the heating and soaking times for the hot-pressing operation, yet thick enough to still function as an adequate barrier. The powdered metal oxide barrier layer 24 is used to at least significantly prevent the ITO material 11 from reacting with the carbide barrier layer 25. Thus, it is contemplated that the foregoing two layer barrier system could be replaced with a single ceramic barrier layer if the ceramic does not react with the ITO material 11 and has sufficient density.

The powders used for the target material 11 and the inner layer 24 may be produced using well known powder preparation techniques, such as ball milling. However, such powder making techniques used do not form a basis for the present invention and therefore are not included herein in detail. The purity of the starting powders 11 and the exemplary ITO targets produced therefrom according to the present invention was typically greater than about 99.99% and 99.95%, respectively. With an ITO starting powder 11 of 5 wt % $SnO_2$, balance $In_2O_3$ (theoretical oxygen content of 60 at % or 17.49 wt %), the typical oxygen content of the resulting ITO targets was about 54.8 to about 55.3 at % (17.1 to 17.3 wt %).

The TiC layer 25 may be coated onto the walls 20, 21 and 22 of the die cavity 19 by using a chemical vapor deposition (CVD) method such as the high-temperature vapor-phase synthesis (HVS) process described in an article written by Garth W. Billings entitled "Vapor-Phase Processing Converts Refractory Metals Into Ceramics" found on pages 45 and 46 of the April 1993 publication of Advanced Materials and Processes, which is incorporated herein by reference in its entirety. Lanxide Corporation of Newark, Del. practices such a process, and using that process, it was found to be more cost effective not to coat the entire graphite ring 13 and punches 17 and 18. Instead, a graphite inner sleeve 28 and two graphite compression plates 29 and 30 were coated. The graphite sleeve 28 forms the inside surface of the ring 13, thereby providing the side wall 22 of the die cavity 19. Each graphite plate 29, 30 forms the leading surface of respective punches 17, 18, thereby providing the top and bottom walls 20 and 21 of the die cavity 19. Using the Lanxide Corporation process, it was found cost effective to coat the entire outer surface of the sleeve 28 and plates 29 and 30 rather than selectively coating only those surfaces forming the walls 20, 21 and 22 of the die cavity 19.

Referring to FIG. 1, with the ring 13, sleeve 28, lower punch 18 and lower plate 30 in place, and the upper punch 17 and upper plate 29 removed, the die cavity 19 may be loaded with the ITO powder 11 and the oxide barrier powder 24. Preferably, prior to loading powder 11 in die cavity 19, an optional gas release device 32 is positioned on top of the carbide coated bottom wall 21 (i.e., the leading surface of the lower compression plate 30). The details of gas release device 32 will be described hereinbelow.

With the lower gas release disk 32 in place, a layer of the $Al_2O_3$ powder 24 is deposited on top of disk 32 and hand tamped with a tamping plate (not shown) to form a more compact powder bed. The powder bed is then leveled to a thickness in the range of about 0.2 inches to about 0.5 inches, and preferably about 0.25 inches. Thereafter, a sheet of $Al_2O_3$ foil 45 having a thickness in the range of about 0.04 inches to about 0.06 inches is placed on top of the bed of oxide barrier powder 24. The sheet 45 is dimensioned to entirely cover the bed of oxide barrier powder 24. Satisfactory results have been obtained using sheets of $Al_2O_3$ foil 45 manufactured by Zircar of Florida, N.Y., under the trade designation APA-2.

After the foil 45 is in place, a plastic collar ring 48 is positioned within the side wall 22 of the die cavity 19 and seated on top of foil 45. The collar ring 48 is dimensioned to snugly slide within side wall 22 and preferably has a wall thickness in the range of about 0.2 inches to about 0.5 inches which corresponds to the thickness desired for the sides of the protective envelope formed with the oxide barrier powder 24. A stainless steel separator ring 49 is then positioned within the collar ring 48 and also seated on top of foil 45. The separator ring 49 is dimensioned to snugly slide within the collar ring 48 and preferably has a wall thickness in the range of about 0.015 inches to about 0.02 inches. Separator ring 49 includes a pair of handles 50 to facilitate removal of the ring 49 from the die cavity 19.

With the collar 48 and separator 49 in place, the ITO powder 11 is loaded into the die cavity 19 inside of the separator ring 49 to a thickness in the range of about 2 inches to about 3 inches, depending upon the desired final target thickness. The ITO powder 11 is then tamped down with hand pressure, leveled, and another sheet 53 of $Al_2O_3$ foil is positioned to cover the top of the ITO powder 11. An aluminum plate 54, having a handle 56, is then positioned on top of the sheet 53. The plate 54 is dimensioned to fit within the separator ring 49 and to cover most of the sheet 53. With the plate 54 and separator ring 49 being held in place, the collar ring 48 is removed from the die cavity 19, leaving a space 58 between the side wall 22 and the separator ring 49. More of the oxide barrier powder 24 is then loaded into the space 58. The oxide barrier powder 24 in space 58 is then hand tamped with the collar ring 48, as shown in FIG. 2. A sufficient amount of the oxide barrier powder 24 is used so that, after tamping, the height of the oxide powder 24 in space 58 is about level with that of the tamped ITO powder 11.

With the plate 54 and the collar ring 48 held in place (see FIG. 2), the separator ring 49 is pulled out of die cavity 19 by handles 50, leaving a gap 60 (see FIG. 3). The collar ring 48 and plate 54 are then removed from die cavity 19. More of the oxide barrier powder 24 is loaded into the cavity 19, hand tamped and then leveled to a thickness in the range of about 0.2 inches to about 0.5 inches above the top sheet of $Al_2O_3$ foil 45, thereby surrounding the ITO powder 11 with an envelope of the oxide barrier powder 24. The powder bed and top layer of the oxide barrier powder 24 are preferably hand tamped using a separate tamping instrument (not shown) from that used to tamp the ITO powder 11 in order to prevent contamination of either powder 11 or 24. Both tamping instruments are similar to the handled plate 54 but with a smaller diameter. After this last tamping operation, an upper gas release disk 42 is placed on top of the upper layer of oxide barrier powder 24. The carbide coated upper graphite plate 29 is then positioned on top of the gas release disk 42. Finally, the balance of the upper punch 17 is positioned on top of the plate 29 as shown in FIG. 3, and the ITO powder 11 is ready to be hot-pressed.

Figure 4:
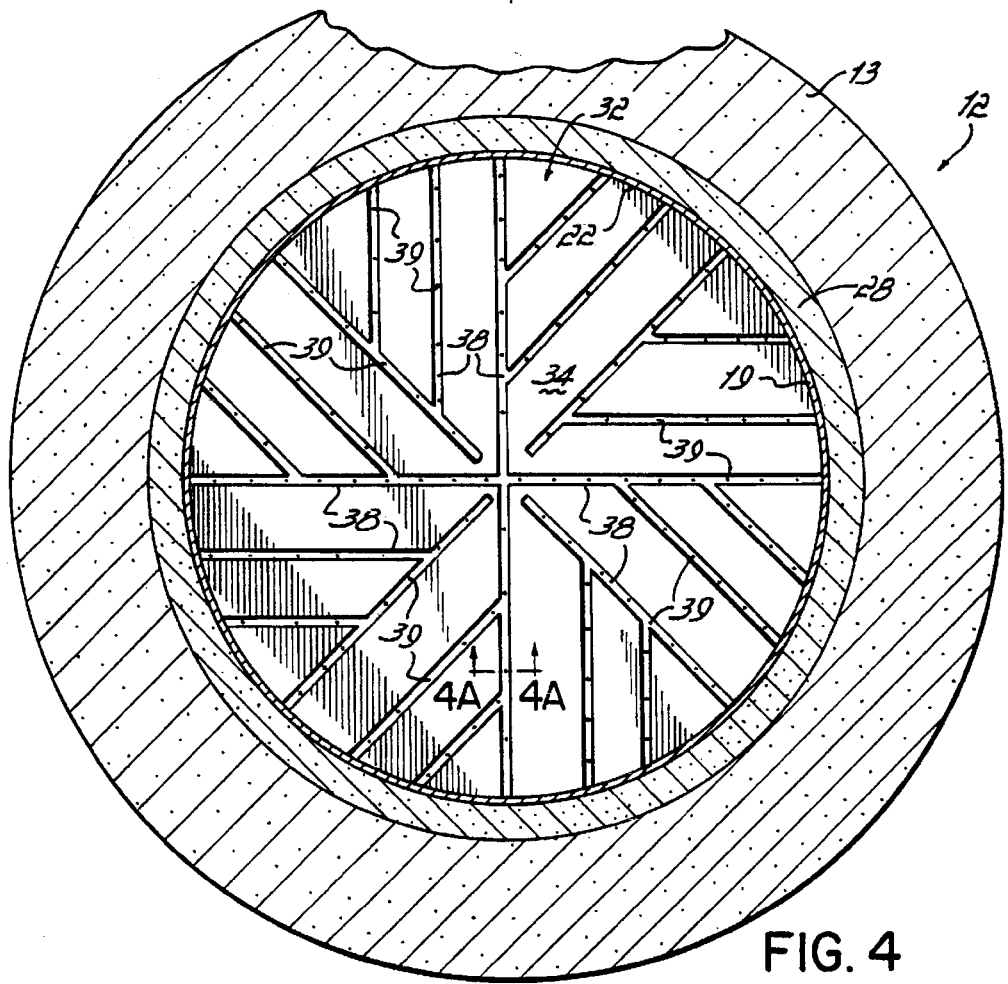
FIG. 4 is a cross-sectional view taken along lines 4—4 of FIG. 3.
Figure 4A:
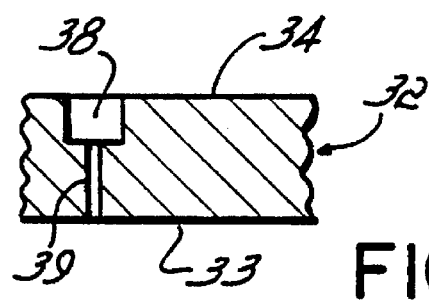
FIG. 4A is an enlarged cross-sectional view taken along lines 4A—4A of FIG. 4.

With reference to FIGS. 3, 4 and 4A, one embodiment of the gas release device 32, 42 is a disk having a first and a second surface 33 and 34, respectively. A plurality of channels or grooves 38 are formed in the second surface 34 and connected to the first surface 33 by a plurality of through holes 39. The disk 32 is dimensioned to cover the bottom wall 21 of die cavity 19, with the second surface 34 facing toward the bottom wall 21. The second gas release disk 42, having the same faces 33, 34, grooves 38 and through holes 39, is similarly oriented with respect to the top wall 20 of die cavity 19. These gas release disks 32 and 42 may be made of graphite coated with a ceramic, such as $Cr_7C_3$, SiC, TaC, TiC, ZrC, or combinations thereof, or preferably made entirely out of a ceramic, such as $Al_2O_3$, MgO, $ZrO_2$, $TiO_2$, SiC, SiN or combinations thereof. The width of each groove 38 is in the range of about 0.05 inches to about 0.3 inches and preferably about 0.1 inches. The depth of each groove 38 is in the range of about 0.02 inches to about 0.1 inches, with a preferable lower limit of about 0.05 inches. In addition, the distance between any two adjacent parallel grooves is in the range of about 0.1 inches to about 1.0 inches, and preferably about 0.75 inches. The diameter of each through hole 39 is in the range of about 0.02 inches to about 0.07 inches, and preferably about 0.05 inches. The distance between two adjacent holes 39 is in the range of about 0.1 inches to about 1.0 inches, and preferably in the range of about 0.25 inches to about 0.5 inches. The thickness of each gas release disk 32, 42 is in the range of about 0.1 inches to about 1.0 inches for ceramic coated graphite disks and in the range of about 0.1 inches to about 0.5 inches for ceramic disks. Preferably, the disks 32, 42 have a thickness of about 0.25 inches regardless of which material they are made of. If the gas release disk is made of ceramic-coated graphite, the coating process is applied after the grooves 38 and holes 39 are formed. The Lanxide Corporation HVS process referred to previously may be used to coat graphite disks. While ceramic disks 32, 42 are reusable, the carbide coating on the graphite disks 32, 42 tends to loose its adherence to the underlying graphite, requiring replacement or recoating of this type of disk after each hot-pressing operation.

During the hot-pressing operation, the ITO powder blend 11 consolidates, with individual particles bonding together. When the ITO powder 11 is hot-pressed at temperatures higher than about 800° C., the ITO material, and in particular the indium oxide ($In_2O_3$), begins to dissociate into vaporous and gaseous components. The amount of such vapor and gas produced depends upon the hot-pressing temperature, the time at that temperature, and the amount of ITO powder 11 being pressed. For example, $In_2O_3$ may dissociate into $In_2O$ vapor and oxygen gas. As the hot-pressing operation progresses, dissociated vapor and gas released from the ITO powder 11 escapes from the die cavity 19 between the graphite punches 17, 18 and the graphite ring 13. It has been found that because of its porosity, the envelope of oxide barrier powder 24 by itself may not prevent dissociated vapor or gas from the ITO powder 11 from attacking and oxidizing the graphite die assembly 12 and may not be adequate to prevent the resulting reducing gases, such as CO, from subsequently attacking and reducing the ITO material to metal. Thus, the carbide coating 25 is utilized to prevent these escaping vapors and gases from oxidizing and deteriorating the graphite walls 20, 21 and 22 of the die cavity 19 and to prevent carbon from the graphite die assembly 12 from penetrating through to the ITO powder 11. It has also been found that if not for the layer of oxide barrier powder 24 preventing direct contact between the ITO powder 11 and the carbide coating 25, an undesirable reaction between the ITO powder and carbide coating may occur.

Because it has a longer distance to travel, dissociated vapor and gas generated at the center of the ITO powder 11 may become trapped inside of the resulting ITO target (not shown). This is especially true with regard to larger diameter targets. Targets having diameters of about 10 inches or more have been known to exhibit a significant amount of retained vapor and gas. Contributing to this problem is the tendency of the ITO powder 11 to condense in a non-uniform manner, with the outer regions condensing and loosing porosity first, thereby trapping such vapor or gas before it can escape. Consolidation of the envelope of oxide barrier powder 24 also slows down the escape of any vapor and gas. It has been found that smaller targets of about 5 inches in diameter do not exhibit as much retained vapor and gas as larger targets of 10 inches in diameter or more.

As with other known sputtering targets, ITO targets of various sizes and shapes have been used to sputter ITO films. ITO sputtering targets are typically circular shaped disks having diameters up to about 12.5 inches, with a thickness of up to about 5 inches, and preferably with a thickness in the range of about 0.15 inches to about 1.0 inches. Rectangular shaped ITO targets have also been used. These targets typically have a length and width ranging respectively from about 15×5 inches to about 40×10 inches, with a thickness comparable to that of the previously described circular disk shaped targets. Although the die cavity 19 shown is circular in cross-section, those skilled in the art will readily understand that graphite die assembly 12 may be adapted to define a die cavity 19 suitable for forming rectangular or other shaped targets without the need for additional drawings. For example, the collar ring 48 and separator ring 49 could be made rectangular in shape and dimensioned to fit within a sleeve (not shown) like sleeve 28 but with a rectangular shaped opening. Rectangular shaped compression blocks (not shown) could also be used instead of circular plates 29 and 30. In addition, the gas release devices 32 and 42 and the sheets 45 and 53 of $Al_2O_3$ foil could be made rectangular shaped rather than circular as illustrated in the figures. The present invention is not intended to be limited by the shape or size of the particular target to be produced.

In order to facilitate the release of dissociated vapors and gases from the ITO powder 11 before the powder 11 is fully densified, the gas release disks 32, 42 were devised to provide readily available pathways for the vapor and gas to exit the die cavity 19. Thus, vapor and gas escape through holes 39 and are channeled along grooves 38 outwardly toward the outer edge of the package of ITO and barrier powders 11 and 24 to escape from die cavity 19 between the graphite punches 17 and 18 and the graphite ring 13. While use of the gas release disks 32 and 42 may not be necessary to produce smaller targets having desirable properties, their use does tend to ensure satisfactory density, consolidation and color uniformity of the target, even for smaller targets, and therefore, their use is preferred.

In addition to reducing the amount of vapor and gas trapped in the ITO powder 11 by using the gas release disks 32, 42 during hot-pressing, the amount of trapped vapor and gas may be reduced even more by using a preliminary heat treatment step. Before the ITO powder 11 is deposited into the die cavity 19, it is preferably subjected to heat treatment comprising heating at least the indium oxide ($In_2O_3$) powder component of the ITO powder blend 11 to a temperature in the range of 1100° C. to 1600° C. in an inert environment and under no pressure. In this way, at least some of the volatile vapors and gases are driven off before the hot-pressing operation.

Figure 5:
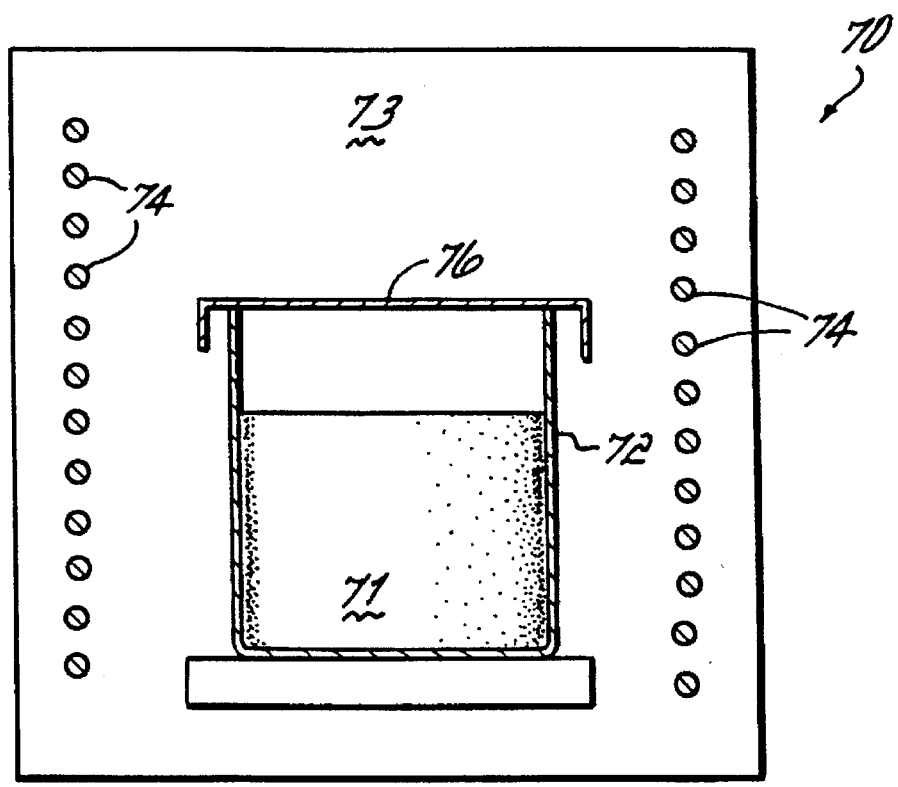
FIG. 5 is a schematic, sectional side view of an apparatus for heat treating the present powdered target starting material prior to hot-pressing according to the principles of the present invention.

In particular, referring to FIG. 5, the preliminary heat treatment includes loading a powder blend 71 of fully oxidized, yellow, indium oxide ($In_2O_3$) powder blended with tin oxide ($SnO_2$) powder into a conventional ceramic crucible 72, such as those made of $Al_2O_3$, $ZrO_2$, MgO or the like. The loaded crucible is then placed in a furnace 70 having a chamber 73 and heating elements which are capable of heating the chamber to a temperature of 1600° C. under an inert gas atmosphere. The furnace chamber 73 is purged with an inert gas, such as argon (Ar), at a rate in the range of about 100 standard cubic feet per hour (SCFH) to about 200 SCFH. The furnace chamber 73 should be purged in this manner regardless of whether a ceramic or graphite furnace 70 is used. With a graphite furnace, the argon atmosphere protects the graphite heating elements 74 from the oxidation that may otherwise occur if the outside air were allowed to enter the chamber 73. Even though a ceramic furnace would not require such protection, the argon atmosphere is necessary in order to obtain significant partial reduction of the $In_2O_3$ powder, since $In_2O_3$ tends to remain stable when heated in an air or oxygen atmosphere. The loaded crucible 72 is then heated to a temperature in the range of about 1100° C. to about 1600° C. The heat treatment temperature is maintained for a time in the range of about 5 hours to about 20 hours. No pressure is applied to the ITO powder 71 during this heat treatment. The heating temperatures and times chosen should be those which will result in the degree of partial reduction of the ITO powder 71 desired. In this way, the initially yellow indium oxide can be partially reduced to blue indium oxide or some other indium oxide desired during subsequent hot pressing. The relatively small amount of tin oxide ($SnO_2$) present in the powder blend 11 generally will have little effect on the overall color of the powder 11. Complete partial reduction of the ITO powder may not be possible without some bonding between the powder particles. If the particles bond together, it will be more difficult to consolidate the powder 71 and obtain the density desired during subsequent hot pressing. Therefore, the temperature and time at temperature should be chosen to maximize the degree of partial reduction without the particles bonding together.

In order to increase the amount of partial reduction for a given temperature and time at temperature, the opening to the crucible 72 may be covered with a thin foil 76 of graphite before the crucible 72 is placed in the furnace chamber 73. After the ITO powder blend 71 has been heated to the temperature and for the time desired, the furnace 70 is turned off and the loaded crucible 72 is allowed to cool to room temperature while remaining in the furnace chamber 73 under the inert gas atmosphere. When room temperature is reached, the powder 71 may be removed and loaded into the die assembly 12 as previously described. By partially reducing the ITO powder before the hot-pressing operation, stronger and tougher targets with higher densities and more uniform color may be produced.

As an example of the preliminary heat treatment operation, 7 kg of ITO powder 11 was deposited into a ceramic crucible that was 12 inches high, with a 6 inch inside diameter and an 8 inch outside diameter. A graphite foil 76 was used to cover the opening of the crucible. The foil 76 had a thickness that ranged from about 0.015 inches to about 0.02 inches, and preferably about 0.02 inches. The loaded crucible 72 was covered with the foil 76 and heated to a temperature of about 1200° C. and held at that temperature for about 10 hours. The furnace chamber 73 was continuously purged with argon gas flowing at about 150 SCFH immediately before, during and after the heating operation until the furnace 70 cooled to about room temperature.

Figure 6:
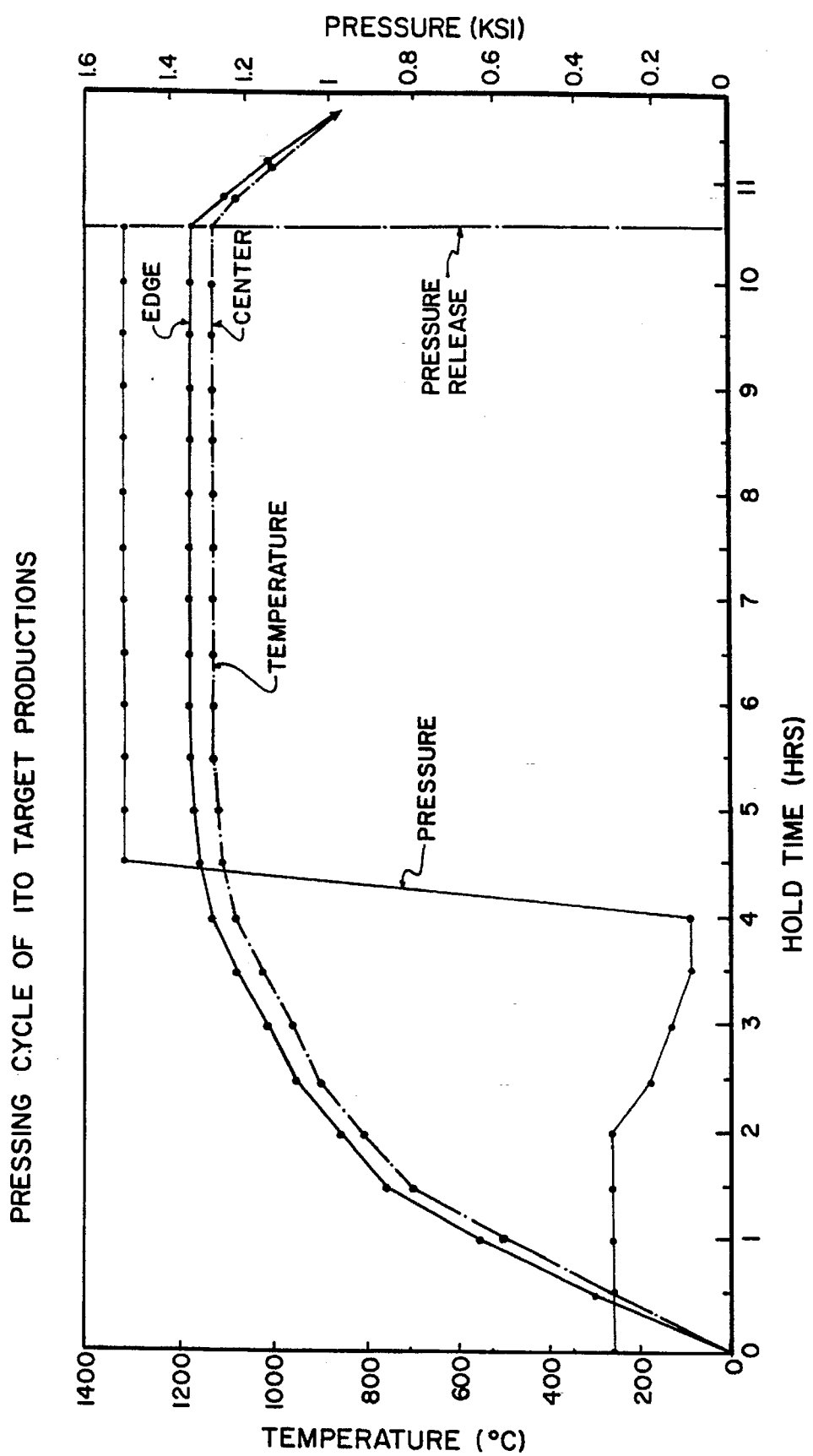
FIG. 6 is a graph showing various parameters of a hot-pressing operation for producing an exemplary ITO sputtering target according to the principles of the present invention.

ITO sputtering targets have been produced according to the principles of the present invention using a consolidation operation which included subjecting the ITO powder 71 to the previously described preliminary heat treatment and then hot pressing the resulting ITO powder 11 in the die assembly 12 in the manner previously described, including using the gas release disks 32 and 42. With reference to FIG. 6, which graphically represents the basic pressing cycle used in ITO target production, the powder package formed by the ITO powder 11 and oxide barrier powder 24 was initially cold-pressed up to about 0.3 ksi (e.g., 4 tons of force applied to a 5.5 inch diameter circular area) at room temperature (about 20° C.) for about 5 minutes. The pressure was applied in the direction of arrows 62 as shown in FIG. 3. After the initial cold-pressing step, the temperature was incrementally increased at a rate controlled to within the range of about 1° C./minute to about 5° C./minute. The temperature inside the die cavity 19 was monitored by using two thermocouples (not shown) positioned inside the die assembly 12. A hole was drilled through the upper punch 17 and both thermocouples were threaded therethrough and positioned between the graphite plate 29 and the upper gas release disk 42. One thermocouple was located along the outer edge and the other thermocouple located in the center of the plate 29 and disk 42.

By way of example, the pressing cycle used in forming ITO sputtering targets generally followed the cycle graphically illustrated in FIG. 6 and tabulated below.

TABLE

PRESSING CYCLE OF ITO TARGET PRODUCTIONS

| Time (minutes) | Temperature (°C.) | | Pressure (ksi) |
| --- | --- | --- | --- |
| | Center | Edge | |
| 0 | 20 | 20 | 0.3 |
| 30 | 250 | 300 | 0.3 |
| 60 | 500 | 550 | 0.3 |

TABLE-continued

PRESSING CYCLE OF ITO TARGET PRODUCTIONS

| Time (minutes) | Temperature (°C.) Center | Temperature (°C.) Edge | Pressure (ksi) |
| --- | --- | --- | --- |
| 90 | 700 | 750 | 0.3 |
| 120 | 800 | 850 | 0.3 |
| 150 | 900 | 950 | 0.2 |
| 180 | 950 | 1000 | 0.15 |
| 210 | 1020 | 1070 | 0.1 |
| 240 | 1075 | 1125 | 0.1 |
| 270 | 1100 | 1150 | 1.5 |
| 300 | 1110 | 1160 | 1.5 |
| 330 | 1120 | 1170 | 1.5 |
| 360 | 1120 | 1170 | 1.5 |
| 390 | 1120 | 1170 | 1.5 |
| 420 | 1120 | 1170 | 1.5 |
| 450 | 1120 | 1170 | 1.5 |
| 480 | 1120 | 1170 | 1.5 |
| 510 | 1120 | 1170 | 1.5 |
| 540 | 1120 | 1170 | 1.5 |
| 570 | 1120 | 1170 | 1.5 |
| 600 | 1120 | 1170 | 1.5 |
| 630 | 1120 | 1170 | 1.5 →0 |
| 645 | 1067 | 1077 | 0 |
| 715 | 917 | 918 | 0 |

More particularly, the powder package of the ITO powder 11 and barrier powder 24 was heated to a temperature of about 800° C. Large temperature gradients in the ITO powder 11 during the hot-pressing consolidation process have been found to cause a discoloration of the finished target. It appears that this discoloration may be avoided by controlling the temperature differential between the center and the outer edge of the powder package to about 50° C. or less. As the powders 11 and 24 began to sinter, the pressure was allowed to drop freely. During this time, the applied temperature continued to increase and when the temperature reached about 1100° C. as reflected by the center thermocouple (not shown) and about 1150° C. as reflected by the outer edge thermocouple (not shown), the temperature was held substantially constant for about 10 minutes before any additional pressure was applied. After this period of time, a minimum of about 1.3 ksi, and preferably about 1.5 ksi, was applied by the graphite die assembly 12. The 1150° C. edge temperature and 1.5 ksi applied pressure was maintained for about 5 hours. After this time, the pressure was released, the furnace was allowed to cool, and the pressed ITO target blank (not shown) was removed from the die cavity 19. It is believed that ITO targets with high density, strength and toughness may also be obtained using a final pressing temperature anywhere in the range of about 1,000° C. to about 1,500° C., with the heating rate being controlled to within the range of about 1° C./minute to about 5° C./minute, while maintaining a pressure in the range of about 1 ksi to about 5 ksi for more than 2 hours.

After the hot-pressing operation is complete and the ITO and barrier powders 11 and 24 have been consolidated and allowed to cool, the resulting package is removed from the die assembly 12. Because they have different coefficients of thermal expansion, the consolidated layer of barrier powder 24 may be peeled off of the resulting target blank (i.e., consolidated ITO powder blend 11). The consolidated layer of barrier powder 24 tends not to bond with the carbide coating 25 thereby making the enveloped target blank readily removable from the die cavity 19. The carbide coating 25 tends to lose its adherence to the graphite sleeve 28 and plates 29 and 30 upon cooling of the die assembly 12, presumably because of the difference in coefficients of thermal expansion between the carbide and the graphite materials. This poor adherence, typically requires the coated sleeve 28 and plates 29, 30 to be either recoated or replaced after each hot-pressing operation. Once the layer of consolidated barrier powder 24 is removed, the resulting ITO target blank may be shaped into its final form, such as by machining. Typically, the surface of the resulting target blank must be finished to a very smooth condition before it is suitable for use as a sputtering target. Such surface finishing may be accomplished by grinding and/or polishing, depending on the final surface finish required. The finished target is then mounted to a backing plate, typically a copper plate, using standard target mounting techniques. The details of such surface finishing and mounting operations do not form a basis for the present invention, are readily known by those skilled in the art of making sputtering targets, and are therefore not included in any detail except as described herein.

The target densities obtainable with the present apparatus and process are in the range of about 90% to about 100% of theoretical density. When the ITO powder blend 11 is partially reduced using the preliminary heat treatment, target densities obtained using the preceding hot-pressing operation have consistently been in the range of about 96% to about 98% of theoretical density. Without the preliminary heat treatment, ITO targets produced according to the principles of the present invention typically exhibited densities in the range of about 90% to about 93% of theoretical density. The flexure strengths of ITO targets manufactured according to the principles of the present invention have typically been greater than 90 MPa and have averaged about 110 MPa. In addition, the fracture mode exhibited by these targets has been transgranular, which is indicative of excellent consolidation of the ITO powder particles (i.e., strong bonding between the particles). These targets also exhibited a uniform dark blue color.

Prior ITO target manufacturing processes using graphite die assemblies without a protective barrier and using similar hot-pressing parameters (e.g., similar temperatures and times at temperature) typically exhibited a significant amount of indium oxide reduced to indium metal, a high evaporation rate of the ITO material and severe oxidation of the graphite die assembly. In an attempt to avoid these disadvantages, the ITO powders were hot-pressed at lower temperatures and/or non-graphite die assemblies were used. However, targets produced by hot-pressing ITO powders at lower temperatures, 1000° C. or less, typically exhibited low densities of about 70% of theoretical density or less and low strengths of about 60 MPa or less. In addition, the fracture mode exhibited was typically intergranular, which is indicative of poor consolidation. The use of non-graphite die assemblies, such as those made of ceramics like $Al_2O_3$ or $ZrO_2$, also has problems. In general, such ceramic die assemblies are more likely to form cracks while in use, require longer heating and soaking times during the hot-pressing operation, and generally increase the costs of the target manufacturing process.

While the present invention has been described with reference to a preferred embodiment and exemplary ceramic metal oxide target materials, it will be understood by those skilled in the art that various changes may be made and equivalents may be substituted for elements thereof without departing from the scope of the invention. In addition, many modifications could be made to adapt the method and apparatus for use with various materials in accordance with the teachings of the invention without departing from the essential scope thereof.

Therefore, it is intended that the present invention not be limited to the particular embodiment disclosed, but that the invention encompasses all embodiments falling within the scope of the appended claims and any equivalents thereof.

What is claimed is:

1. A process for making a metal oxide sputtering target, comprising the steps of:

providing a graphite die assembly having a die cavity with graphite walls; providing a first metal oxide material and a second metal oxide material;

wherein the first metal oxide material comprises a material in powder form which is volatile and thermally unstable at the elevated temperature, and wherein the at least one layer of the second material substantially prevents a reducing gas from penetrating to the first material during the hot-pressing step, wherein the die cavity having a bottom, side and top wall, the process including providing a collar ring and a separator ring, depositing a layer of the second material in powder form above the bottom wall, positioning the collar ring within the side wall of the die cavity and the separator ring within the collar ring, loading the first material inside of the separator ring, removing the collar from the die cavity thereby leaving a space, depositing powder of the second material into the space, removing the separator ring from the die cavity, and depositing a top layer of the second material in powder form thereabove, the first material being thereby surrounded by a layer of the second material, hot-pressing the materials at an elevated temperature using the graphite die assembly to produce a metal oxide target blank.

2. The process of claim 1, the first material includes an indium oxide and tin oxide.

3. The process of claim 2, the first material includes particles of $In_2O_3$ and $SnO_2$.

4. The process of claim 3, the first material containing in the range of about 5 to about 15 weight percent $SnO_2$, with the balance being substantially $In_2O_3$.

5. The process of claim 1, the second material includes a powdered ceramic oxide that is more stable at the elevated temperature reached during hot-pressing than the first material.

6. The process of claim 1, the second material includes a powdered ceramic metal oxide from the group consisting of $Al_2O_3$, MgO, $TiO_2$, $ZrO_2$, and combinations thereof.

7. The process of claim 6 including disposing the first and second materials into the die cavity such that the first material is surrounded by a layer of the powdered ceramic metal oxide having a thickness in the range of about 0.2 inches (5.08 mm) to about 0.5 inches (12.7 mm).

8. The process of claim 1, the second material includes a non-oxide ceramic.

9. The process of claim 8 including coating the graphite walls of the die cavity with a layer of the non-oxide ceramic.

10. The process of claim 9, the non-oxide ceramic includes a ceramic carbide selected from the group consisting of $Cr_7C_3$, SiC, TaC, TiC, ZrC, and combinations thereof.

11. The process of claim 10, the non-oxide ceramic layer having a thickness in the range of about 30 microns to about 100 microns.

12. The process of claim 1, the second material comprising a ceramic oxide component in powder form and a non-oxide ceramic component, each component being more stable at the elevated temperature than the first material, and the process including disposing the first and second materials into the die cavity such that a layer of each component surrounds the first material.

13. The process of claim 12, the layer of the ceramic oxide component forming an inner layer and the layer of the non-oxide ceramic component forming an outer layer.

14. The process of claim 13, the inner layer having thickness in the range of about 0.2 inches (5.08 mm) to about 0.5 inches (12.7 mm), and the outer layer having a thickness in the range of about 30 microns to about 100 microns.

15. The process of claim 1 including providing two sheets of the second material, covering the powder layer of the second material deposited above the bottom wall with one sheet before the collar ring and separator ring are positioned within the die cavity and covering the first material loaded inside the die cavity with the other sheet before the top powder layer of the second material is deposited thereabove.

16. The process of claim 15, each sheet of the second material having a thickness in the range of about 0.04 inches (1.02 mm) to about 0.06 inches (1.52 mm).

17. The process of claim 1 including tamping down the powdered first material and the powdered layer of the second material surrounding the first material before the hot-pressing operation.

18. The process of claim 1, the second material including another component, and the process including coating the graphite walls of the die cavity with a layer of the other component.

19. The process of claim 1 including providing a gas release device having a surface, an outer edge and a plurality of pathways interconnecting the surface and the outer edge, and disposing the gas release device into the die cavity such that the surface faces the first material during the hot-pressing operation.

20. The process of claim 19 including providing a gas release device having two surfaces, one surface having an outer edge and a plurality of pathways interconnecting the other surface and the outer edge, and disposing the gas release device into the die cavity such that the one surface faces at least one wall of the die cavity and the other surface faces the first material during the hot-pressing operation.

21. The process of claim 20, the gas release device including at least one disk having two surfaces, one surface having an outer edge and a plurality of grooves formed thereon, each of the plurality of grooves being connected to the outer edge, and a plurality of through holes connecting the plurality of grooves to the other surface, the die cavity having a top, bottom and side wall, and the process including disposing the at least one disk into the die cavity such that the one surface faces one or the other of the top and bottom walls and the other surface faces the first material.

22. The process of claim 1 including partially reducing the first material before it is disposed into the die cavity.

23. The process of claim 22 including heat treating the first material in order to partially reduce the metal oxide powder without the metal oxide powder being substantially bonded together.

24. The process of claim 23 including heat treating the first material in a partially reducing atmosphere.

25. The process of claim 24 including providing graphite material in the presence of the first material as a source of the partially reducing atmosphere.

* * * * *